(12) United States Patent
Yamano et al.

(10) Patent No.: US 7,884,484 B2
(45) Date of Patent: Feb. 8, 2011

(54) WIRING BOARD AND METHOD OF MANUFACTURING THE SAME

(75) Inventors: Takaharu Yamano, Nagano (JP); Masahiro Sunohara, Nagano (JP); Hajime Iizuka, Nagano (JP); Tetsuya Koyama, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 573 days.

(21) Appl. No.: 11/372,916

(22) Filed: Mar. 10, 2006

(65) Prior Publication Data

US 2006/0208356 A1 Sep. 21, 2006

(30) Foreign Application Priority Data

Mar. 15, 2005 (JP) ............... 2005-073946

(51) Int. Cl.
- *H01L 23/48* (2006.01)
- *H01L 23/52* (2006.01)
- *H01L 29/40* (2006.01)

(52) U.S. Cl. .............. 257/777; 257/E23.169; 257/E21.502; 257/E23.178; 438/108; 29/830; 29/846; 29/847; 29/835; 29/832; 174/262; 174/255

(58) Field of Classification Search ........... 257/777, 257/E23.169, E21.502, E23.178; 438/108; 29/830, 846, 847, 835, 832; 174/262, 255
See application file for complete search history.

(56) References Cited

U.S. PATENT DOCUMENTS

| | | | |
|---|---|---|---|
| 4,737,395 A | 4/1988 | Mabuchi et al. | |
| 4,773,955 A | 9/1988 | Mabuchi et al. | |
| 6,100,594 A | 8/2000 | Fukui et al. | |
| 6,121,553 A | 9/2000 | Shinada et al. | |
| 6,853,087 B2 | 2/2005 | Neuhaus et al. | |
| 6,864,165 B1 | 3/2005 | Pogge et al. | |
| 2003/0000736 A1 | 1/2003 | Sathe | |
| 2003/0015342 A1* | 1/2003 | Sakamoto et al. | 174/250 |
| 2003/0062624 A1 | 4/2003 | Asahi et al. | |
| 2004/0004293 A1* | 1/2004 | Murayama | 257/780 |
| 2005/0016763 A1* | 1/2005 | Zollo et al. | 174/256 |
| 2006/0207088 A1 | 9/2006 | Yamano | |
| 2006/0255440 A1 | 11/2006 | Miyazaki et al. | |

FOREIGN PATENT DOCUMENTS

| | | |
|---|---|---|
| EP | 1 304 742 | 4/2003 |
| JP | 2001-015638 | 1/2001 |
| JP | 2001-196525 | 7/2001 |

(Continued)

OTHER PUBLICATIONS

U.S. Appl. No. 11/373,610, Wiring Board Manufacturing Method, Yakaharu Yamano, filed Mar. 10, 2006.

*Primary Examiner*—Lynne A Gurley
*Assistant Examiner*—Meiya Li
(74) *Attorney, Agent, or Firm*—Rankin, Hill & Clark LLP

(57) ABSTRACT

A wiring board includes an insulating layer in which a semiconductor chip is embedded, and a wiring structure connected to the semiconductor chip. A reinforcing member reinforcing the insulating layer is embedded in the insulating layer. This enables reduction in a thickness of the wiring board and a suppression of warpage of the wiring board.

9 Claims, 17 Drawing Sheets

FOREIGN PATENT DOCUMENTS

| | | |
|---|---|---|
| JP | 2001-217381 | 8/2001 |
| JP | 2002-100696 | 4/2002 |
| JP | 2003-347741 | 12/2003 |
| TW | 1245388 * | 12/2005 |
| WO | 03100851 | 12/2003 |
| WO | 2004077903 | 9/2004 |
| WO | 2005109499 | 11/2005 |

* cited by examiner

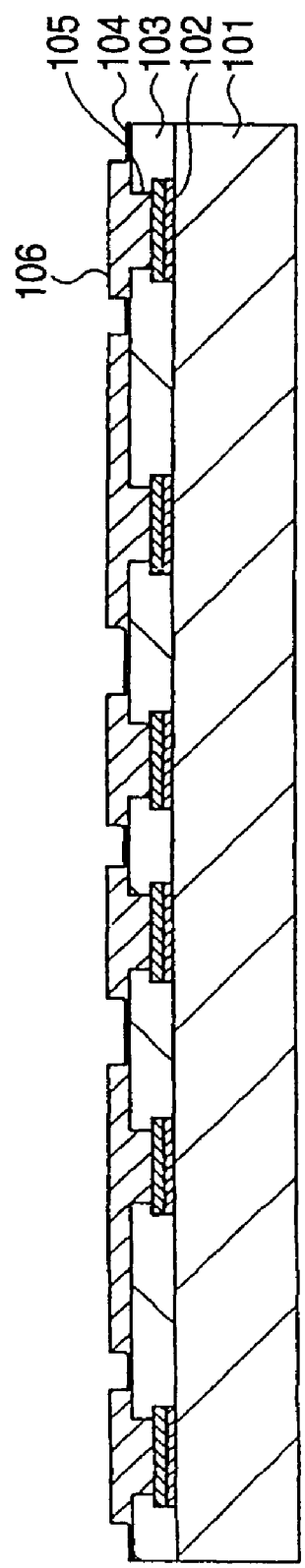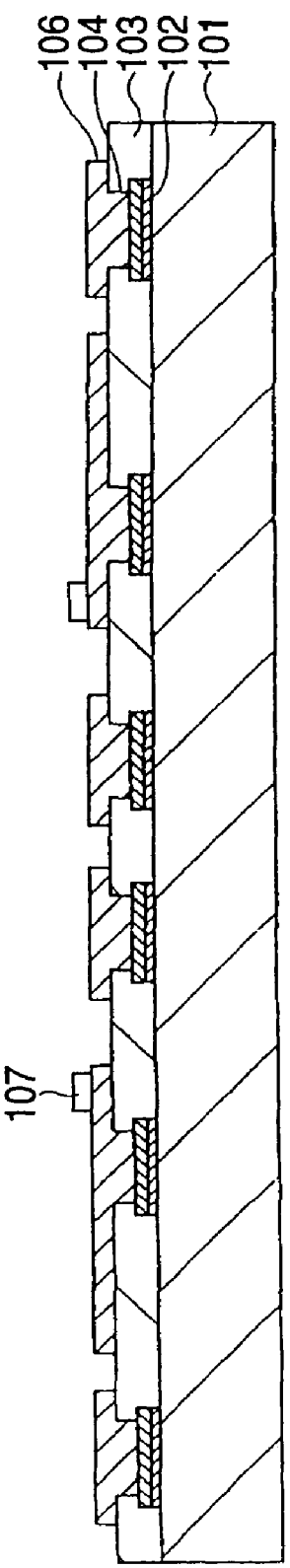

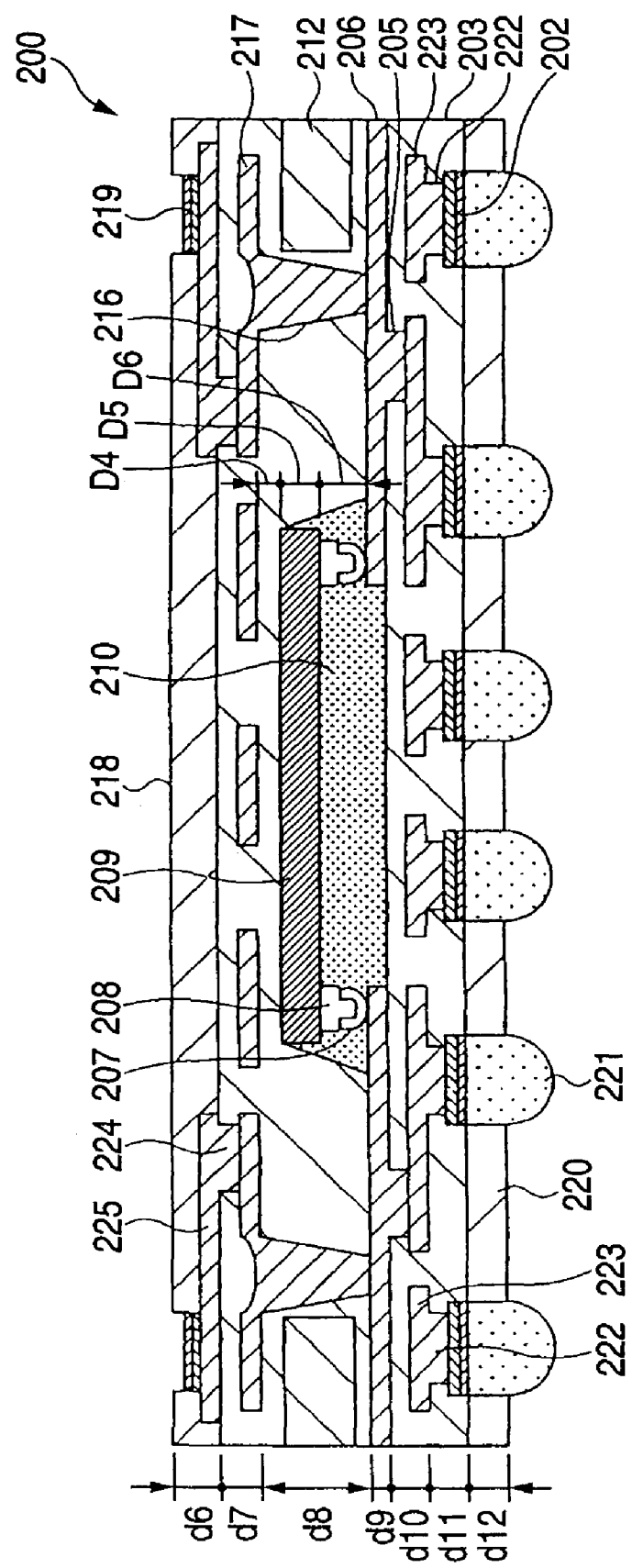

WIRING BOARD AND METHOD OF MANUFACTURING THE SAME

This application claims foreign priority based on Japanese Patent application No. 2005-073946, filed Mar. 15, 2005, the content of which is incorporated herein by reference in its entirety.

BACKGROUND OF THE INVENTION

1. Field of the Invention

The present invention relates to a method of manufacturing a wiring board, and more particularly, to a method of manufacturing a wiring board incorporating a semiconductor chip.

2. Description of the Related Art

Currently, enhancement in performance of electronic devices using semiconductor devices such as semiconductor chips has been advanced. Higher-density of semiconductor chips mounted on a board, reduction in size of the board on which the semiconductor chips are mounted, and saving of space in the board are demanded.

Thus, a board in which a semiconductor chip is embedded, that is, a built-in chip type wiring board has been proposed. Various configurations for incorporating the semiconductor chip in the board have been proposed (for example, refer to JP-A-2001-196525). Such a built-in chip type wiring board has a wiring structure connected to a semiconductor chip. Also, a terminal connection portion is formed on the wiring board so that the wiring board can be connected to another device, a motherboard, or the like.

However, in a case where reduction in thickness (thin) and higher-density in the built-in chip type wiring board are realized, warpage of the wiring board may be a problem. In order to deal with such warpage of the wiring board, it is necessary to laminate a board having a predetermined thickness such as a core board, with a layer in which a semiconductor chip is embedded, so that the wiring board has a structure suppressing the warpage. Consequently, in the built-in chip type wiring board with such a laminated structure, it is difficult to realize the reduction in the thickness of the wiring board and the higher-density in the wiring board.

Also, it is difficult to achieve the reduction in the thickness of the wiring board while suppressing the warpage of the wiring board.

SUMMARY OF THE INVENTION

An object of the present invention is to provide a novel and a useful wiring board and a method of manufacturing the wiring board, thereby solving the aforementioned problems.

In the present invention, reduction in thickness of a wiring board incorporating semiconductor chips is achieved, and warpage of such a wiring board is suppressed.

In some implementations, a wiring board of the invention comprises: at least one semiconductor chip; an insulating layer in which said at least one semiconductor chip is embedded; a wiring structure being connected to the semiconductor chip; and at least one reinforcing member for reinforcing the insulating layer, the reinforcing member being embedded in the insulating layer.

This wiring board has a structure that enables the suppression of the warpage of the wiring board and the reduction in the thickness of the wiring board.

In the wiring board of the invention, therein forcing member and the semiconductor chip are mounted on substantially a same plane. Thus, reduction in the thickness of the wiring board can be achieved.

In the wiring board of the invention, the reinforcing member is formed so as to surround the semiconductor chip. Thus, the effect of suppressing the warpage of the wiring board can favorably be enhanced.

In the wiring board of the invention, the wiring structure has a multilayer wiring structure. Thus, a higher-density of the wiring structure can be achieved. Consequently, this embodiment is favorable.

In the wiring board of the invention, the wiring structure includes: a first wiring substructure being formed on a first side of the semiconductor chip; and a second wiring substructure being formed on a second side of the semiconductor chip. Thus, a higher-density of the wiring structure can be achieved. Consequently, this embodiment is favorable.

In the wiring board of the invention, the first wiring substructure and the second wiring substructure are connected by a via plug being formed in the insulating layer. Thus, a higher-density of the wiring structure can be achieved. Consequently, this embodiment is favorable.

The wiring board of the invention further comprises: a first terminal connection portion formed on a first surface of the wiring board, the fist terminal connection portion being connected to the semiconductor chip through the wiring structure; and a second terminal connection portion formed on a second surface of the wiring board, the second terminal connection portion being connected to the semiconductor chip through the wiring structure. Thus, the terminal connection portion can be connected to the semiconductor chip at each of both sides corresponding to the first surface and the second surface, respectively.

In the wiring board of the invention, therein forcing member is made of an organic core material or a metal material.

In some implementations, a method of manufacturing a wiring board of the invention comprises: forming a lower-layer wiring structure; mounting at least one semiconductor chip on the lower-layer wiring structure, the semiconductor chip being connected to the lower-layer wiring structure; forming at least one reinforcing member; and forming an insulating layer so as to embed the semiconductor chip and the reinforcing member in the insulating layer, the reinforcing member reinforcing the insulating layer.

This method of manufacturing a wiring board enables the suppression of warpage of the wiring board and the reduction in the thickness of the wiring board.

In the method of manufacturing the wiring board of the invention, the reinforcing member and the semiconductor chip are mounted on substantially a same plane. Thus, reduction in the thickness of the wiring board can be achieved.

The method of manufacturing the wiring board of the invention further comprises: forming a via plug in the insulating layer, and connecting the via plug to the lower-layer wiring structure; and forming an upper-layer wiring structure so that the semiconductor chip is mounted between the lower-layer wiring structure and the upper-layer wiring structure, and connecting the upper-layer wiring structure to the via plug. Thus, a higher-density of the wiring structure can be achieved. Consequently, this embodiment is favorable.

In the method of manufacturing the wiring board of the invention, the lower-layer wiring structure is formed on a core board, and the method further comprises: removing the core board. Thus, reduction in the thickness of the wiring board can be achieved. Also, the wiring board can stably be formed. Consequently, this embodiment is favorable.

In the method of manufacturing the wiring board of the invention, the core board is made of an electrically conductive material, and the forming step of the lower-layer wiring structure includes forming the lower-layer wiring structure by electrolytic plating using the core board as an electrode. This facilitates supply of electric power when the electrolytic plating is performed. Thus, this embodiment is favorable.

In the method of manufacturing the wiring board of the invention, the semiconductor chip is electrically connected to the lower-layer wiring structure through a stud bump being formed on the semiconductor chip. Thus, reliability of connection between the semiconductor chip and the wiring structure can be enhanced.

The method of manufacturing the wiring board of the invention further comprises: forming a connecting portion made of solder between the stud bump and the lower-layer wiring structure. Thus, the reliability of connection between the semiconductor chip and the wiring structure can be enhanced.

According to the invention, the reduction in the thickness of the wiring board incorporating semiconductor chips is realized, and also the suppression of the warpage of such a wiring board is possible.

BRIEF DESCRIPTION OF THE DRAWINGS

FIG. 3E is a fifth view illustrating a method of manufacturing the wiring board according to a first embodiment.

FIG. 3F is a sixth view illustrating a method of manufacturing the wiring board according to a first embodiment.

FIG. 3O is a fifteenth view illustrating a method of manufacturing the wiring board according to a first embodiment.

FIG. 4 is a view illustrating a first modification of the wiring board shown in FIG. 1.

DESCRIPTION OF THE PRFERRED EMBODIMENTS

Next, embodiments of the invention are described below with reference to the accompanying drawings.

First Embodiment

Figure 1:
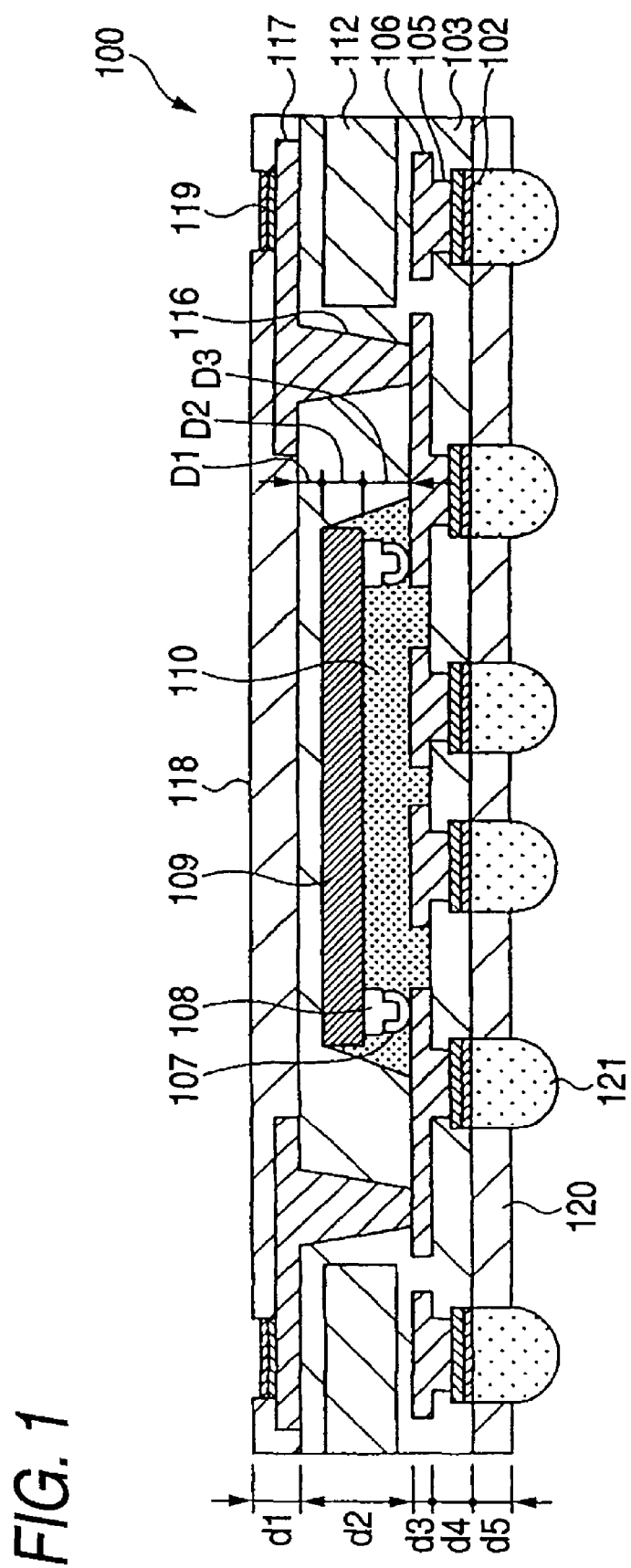
FIG. 1 is a cross-sectional view schematically illustrating a wiring board according to a first embodiment of the invention.

FIG. 1 is a cross-sectional view schematically showing a wiring board 100 according to a first embodiment of the invention.

Referring to FIG. 1, the wiring board 100 according to this embodiment includes a semiconductor chip 109 embedded in an insulating layer 103, and a wiring structure connected to the semiconductor chip 109. This wiring structure has pattern wirings 106 and 117, and via plugs 105 and 116.

Moreover, the wiring board 100 has a terminal connection portion 102 formed at a first side thereof and a terminal connection portion 119 formed at a second side which is opposite to the first side thereof. The terminal connection portions 102 and 119 are connected to the semiconductor chip 109 through the wiring structure.

Hitherto, in the case of reducing the thickness of such a built-in semiconductor chip type wiring board, the wiring board and a structural body such as a core board which supports the wiring board and suppresses the warpage of the wiring board are sometimes laminated. Therefore, it is difficult to achieve both of the reduction in the thickness of the wiring board and the suppression of the warpage thereof.

Thus, the wiring board 100 according to this embodiment is configured so that a reinforcing member 112 preventing the warpage by reinforcing the insulating layer 103 is embedded in the insulating layer 103 in which the semiconductor chip 109 is embedded. The warpage of the wiring board 100 can be suppressed by using the reinforcing member 112. In the case of the aforementioned structure, the warpage of the wiring board 100 can effectively be suppressed without practically increasing the thickness of the wiring board 100.

In FIG.1, the single semiconductor chip 109 is provided in the wiring board 100 so as to simplify the drawing and the description. However, a plurality of the semiconductor chips 109 may be mounted in the wiring board 100 similarly to the configuration in which the single semiconductor chip 109 is mounted. Also, in this case, by embedding the reinforcing member 112 in the insulating layer 103, the warpage of the wiring board 100 can be suppressed similarly.

Thus, this embodiment has a structure enabled to reduce the thickness of the wiring board, as compared with the wiring board having a structure in which the insulating layer 103 and the core board for supporting the insulating layer 103 are laminated.

Next, details of the configuration of the wiring board 100 are described. For example, the wiring structure connected to the semiconductor chip 109 includes the pattern wirings 106 and 117, and the via plugs 105 and 116, which are made of, for example, Cu. These wiring structures are connected to the semiconductor chip 109.

Stud bumps 108 made of, for example, Au are formed on electrode pads (not shown) of the semiconductor chip 109, and are electrically connected to the pattern wiring 106 through connecting portions 107 made of, for example, solder. By using the stud bumps 108, reliability of the electrical connection between the semiconductor chip 109 and the wiring pattern 106 is enhanced. Also, by forming the connecting portions 107 between the stud bumps 108 and the pattern wiring 106, the reliability of the electrical connection therebetween is further enhanced.

The pattern wiring 106 is formed integrally with a via plug wiring 105. The terminal connection portion 102 including, for instance, a Au/Ni plated layer is formed at a side opposite to the side at which the via plug wiring 105 is connected to the pattern wiring 106. This terminal connection portion 102 is formed so that one surface thereof is exposed from the insulating layer 103. A solder resist layer 120 is formed so as to cover the insulating layer 103 and surround the terminal connection portion 102. Solder bumps 121 may be formed on the terminal connection portions 102, as needed.

A pattern wiring 117 is formed on, for example, the insulating layer 103 at a side of the semiconductor chip 109 which is opposite to the side at which the pattern wiring 106 is formed. The pattern wirings 117 and 106 are connected by the via plug 116. For instance, the via plug 116 and the pattern wiring 117 are formed integrally.

The terminal connection portion 119 including, for example, a Ni/Au plated layer is formed on the pattern wiring 117. A solder resist layer 118 is formed on the insulating layer 103 and the pattern wiring 117 so as to surround the terminal connection portion 119.

For example, a build-up resin used in what is called a build-up board can be used for the insulating layer 103. For example, a heat-hardening resin material such as an epoxy resin and a polyimide resin can be used.

Preferably, an underfill layer 110 made of a resin material is formed between the semiconductor chip 109 and the pattern wiring 106 or between the semiconductor chip 109 and the insulating layer 103.

The wiring board 100 may be configured so that, for example, the solder resist layers 118 and 120 and the solder bumps 121 are omitted.

In the wiring board 100 according to this embodiment, the terminal connection portions which can be connected to the semiconductor chip 109 are provided on both sides of the wiring board, respectively. Thus, this wiring board 100 is configured so that objects to be connected thereto such as another device, another semiconductor chip and a motherboard can be easily connected to both sides of the wiring board 100.

Various materials can be used for the reinforcing member 112. For example, resin materials harder than the insulating layer 103, which are, for instance, organic core materials (sometimes referred to as pre-preg materials) used in the core board or the like, metallic materials such as Cu, Ni, Fe, alloy materials of these metallic materials, or composite materials may be used.

Preferably, the reinforcing member 112 is formed on substantially the same plane as a plane on which the semiconductor chip 109 is formed. Thus, the reinforcing member 112 is embedded in the insulating layer 103 without increasing the thickness of the insulating layer 103.

The wiring board 100 according to this embodiment can be formed in various shapes and thicknesses according to a specification of the semiconductor chip and a specification for connection. An example of the practical thickness of the wiring board is described below.

For example, in a case where a thickness D2 of the semiconductor chip 109 is set to be 80 μm, a distance D1 from an upper end surface of the semiconductor chip 109 to the solder resist layer 118 is 20 μm. A distance D3 from a lower end surface of the semiconductor chip 109 to an upper end surface of the pattern wiring 106 is 45 μm.

A thickness d1 of the solder resist layer 118 and a thickness d5 of the solder resist layer 120 are 30 μm. A distance d4 from an upper end surface of the solder resist layer 120 to a lower end surface of the pattern wiring 106 is 25 μm. A thickness d3 of the pattern wiring 106 is 10 μm. A distance d2 from the upper end surface of the pattern wiring 106 to a lower end surface of the solder resist layer 118 is 145 μm.

In this case, the thickness of the wiring board (excluding the solder bump 112) is equal to 240 μm.

Figure 2A:
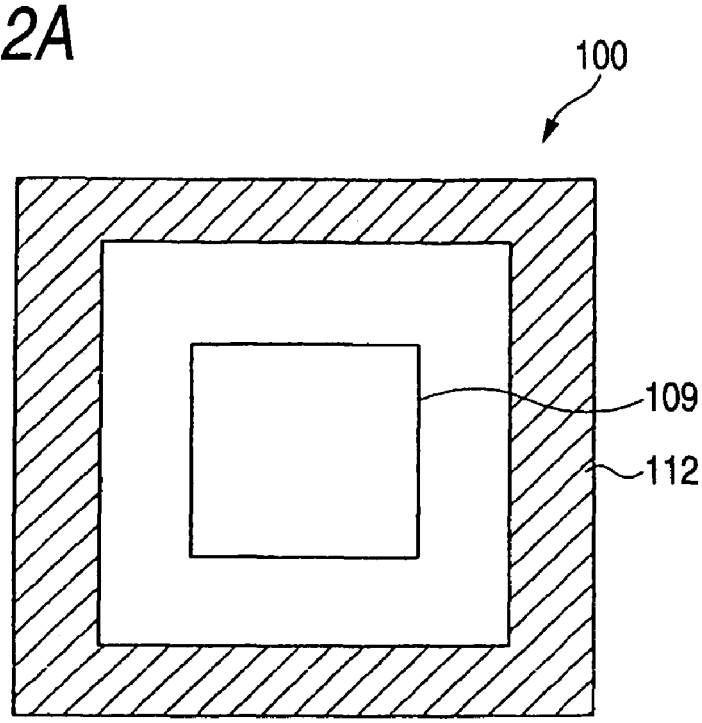
FIG. 2A is a first view illustrating a method of providing a reinforcing member according to a first embodiment.

FIG. 2A schematically shows a plan view of the wiring board 100 shown in FIG. 1. Incidentally, in FIG. 2A, the drawing of components other than the semiconductor chip 109 and the reinforcing member 112 is omitted. As shown in FIG. 2A, the reinforcing member 112 is formed around the semiconductor chip 109 so as to surround the semiconductor chip 109, for example. Thus, the advantage in preventing the warpage is favorably enhanced. Incidentally, a single semiconductor chip or a plurality of the semiconductor chips may be mounted thereon.

The reinforcing member is not limited to the aforementioned example. For instance, the shape of the reinforcing member can be changed in various manners as described below.

Figure 2B:
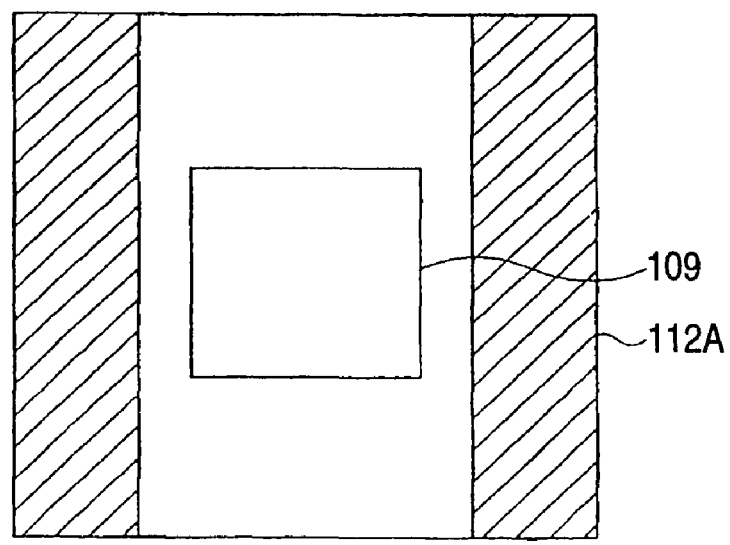
FIG. 2B is a second view illustrating a method of providing the reinforcing member according to a first embodiment.
Figure 2C:
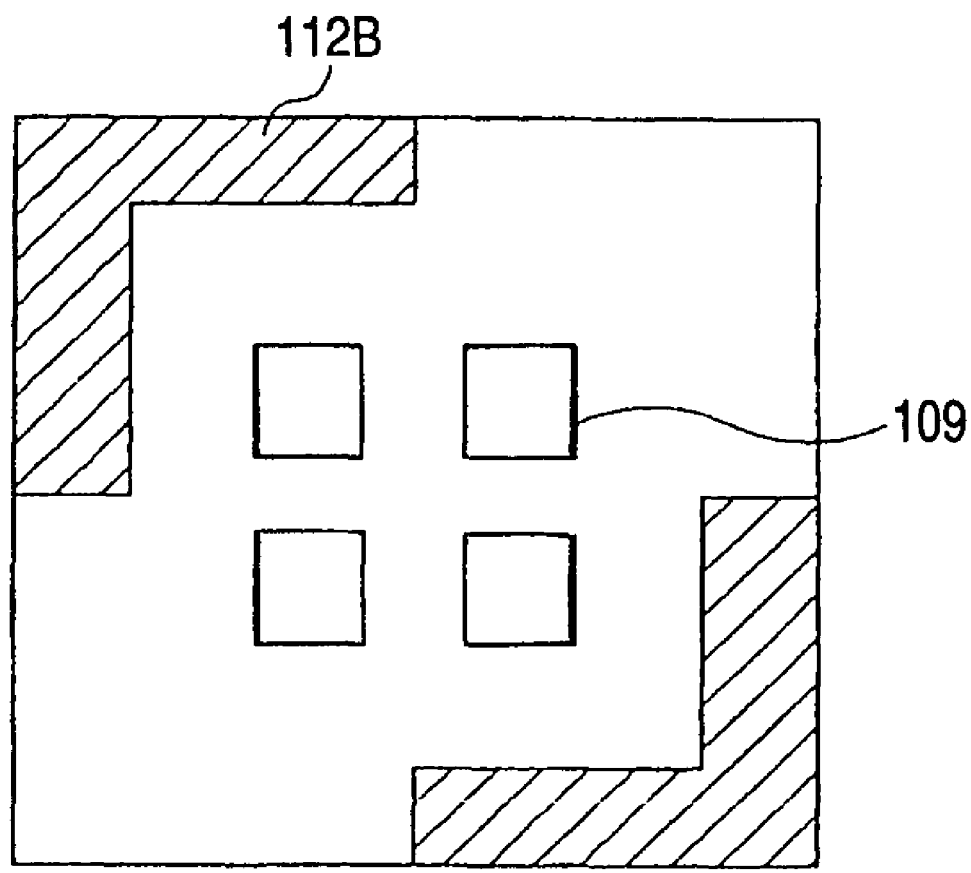
FIG. 2C is a third view illustrating a method of providing the reinforcing member according to the first embodiment.

FIGS. 2B and 2C are views showing modifications of the reinforcing member shown in FIG. 2A. Incidentally, the aforementioned components shown in FIG. 2A are designated in FIGS. 2B and 2C by the same reference numerals as those used in FIG. 2A. Thus, the description of such components is omitted. Therein forcing member may be modified like reinforcing members 112A shown in FIG. 2B, which are placed on both sides (end portions) of the wiring board, respectively, and are opposed to each other. Alternatively, the reinforcing member may be modified like reinforcing members 112B shown in FIG. 2C, which are placed in vicinities of corner portions of the wiring board, respectively, and are opposed to each other. In FIG. 2C, the reinforcing member 112 is formed so as to partially surround the plurality of semiconductor chips. As stated above, various modifications and alterations of the reinforcing member may be made according to a size of the semiconductor chip, a wiring structure, or specification of the wiring board.

Next, an example of a method of manufacturing the wiring board 100 shown in FIG. 1 according to this embodiment of the invention is described below sequentially in order of steps with reference to FIGS. 3A to 3O.

Figure 3A:
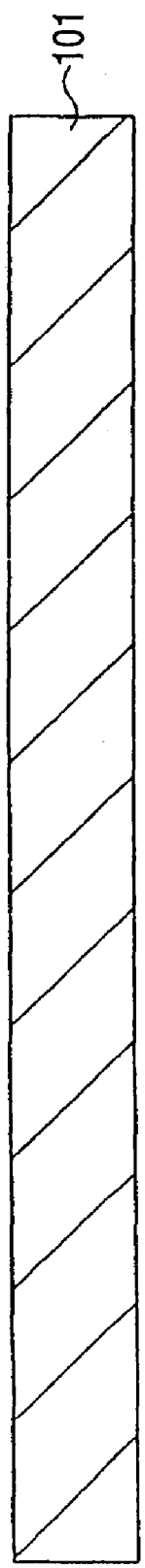
FIG. 3A is a first view illustrating a method of manufacturing the wiring board according to a first embodiment.

First, as illustrated in FIG. 3A, a core board 101 made of Cu, of which thickness is, for example, 200 μm, is prepared.

Figure 3B:
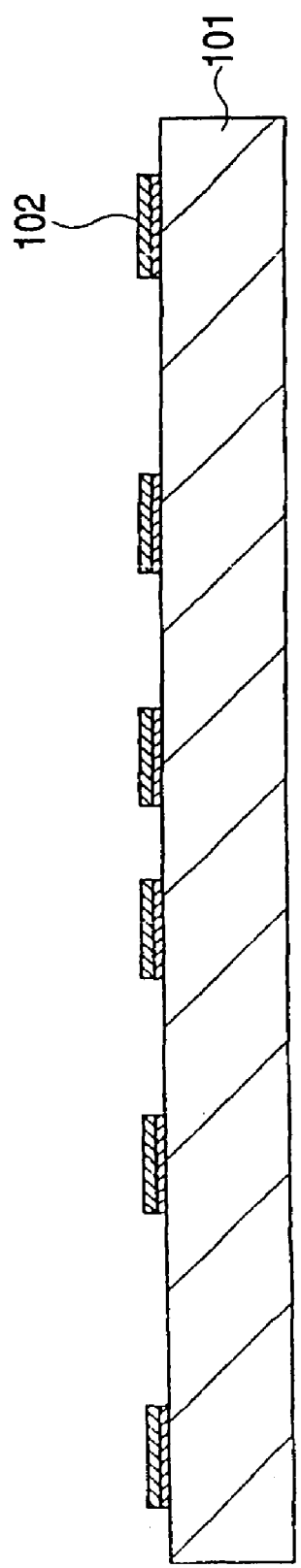
FIG. 3B is a second view illustrating a method of manufacturing the wiring board according to a first embodiment.

Subsequently, in a step illustrated in FIG. 3B, the terminal connection portion 102 made of, for example, Au/Ni is formed on the core board 101 by electrolytic plating using a resist pattern as a mask on which patterning is performed by a lithography process, and also using the core board as an electrode. Thus, in a case where the core board 101 is made of an electrically conductive material, the core board can be used as an electrode used at the electrolytic plating. In the case of performing electrolytic plating in the subsequent steps, the core board is used as the electrode (or an energizing path at the time of electrolytic plating), as required. The resist pattern is peeled off after the terminal connection portion 102 is formed.

Figure 3C:
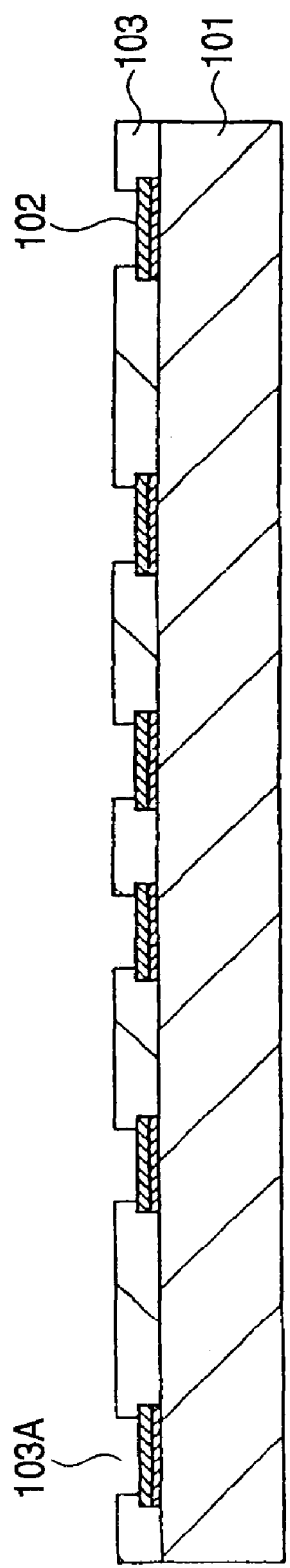
FIG. 3C is a third view illustrating a method of manufacturing the wiring board according to a first embodiment.

Subsequently, in a step shown in FIG. 3C, the insulating layer 103 made of a resin material such as an epoxy resin is formed by laminating or application, for example, so as to cover the terminal connection portion 102. Furthermore, via holes 103A are processed by using, for instance, laser beams so that the terminal connection portions are exposed. Also, preferably, after the via holes 103A are formed, desmear process is performed as needed, in which residues are removed and the surface of the insulating layer 103 is roughened.

Figure 3D:
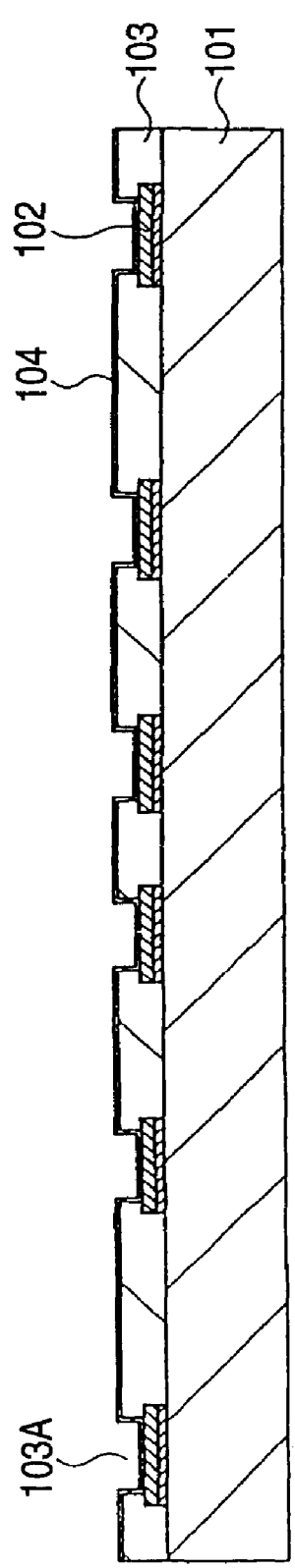
FIG. 3D is a fourth view illustrating a method of manufacturing the wiring board according to a first embodiment.

Subsequently, in a step shown in FIG. 3D, a seed layer 104 is formed on the surface of the insulating layer 103 and the surface of the terminal connection portion 102 by, for instance, electroless Cu plating.

Subsequently, in a step shown in FIG. 3E, the via plugs 105 are formed by, for example, electrolytic Cu plating, using a resist pattern as a mask on which patterning is performed by the lithography process, so as to bury the via holes 103A. Also, the pattern wiring 106 to be connected to the via plugs 105 is formed integrally with the via plugs 105. Upon completion of performing the electrolytic plating, the resist pattern is peeled off.

Subsequently, in a step shown in FIG. 3F, unnecessary portions of the seed layer 104 formed on the insulating layer 103 are removed by etching. Then, the connecting portions 107 made of, for example, solder are formed on the pattern wiring 106 by electrolytic plating, using a resist pattern that is formed on the insulating layer 103 and the pattern wiring 106, and using the resist pattern as a mask on which patterning is performed by a lithography process.

In this case, preferably, a Ni-layer is formed between the connecting portion 107 and the pattern wiring 106 as a barrier layer. Upon completion of the electrolytic plating, the resist pattern is peeled off. Also, in this case, a method of forming the connecting portions 107 is not limited to the electrolytic plating. For example, a method of applying an adhesive material onto the pattern wiring 106, and applying fine solder powder so that the solder powder sticks to the adhesive material may be employed.

Figure 3G:
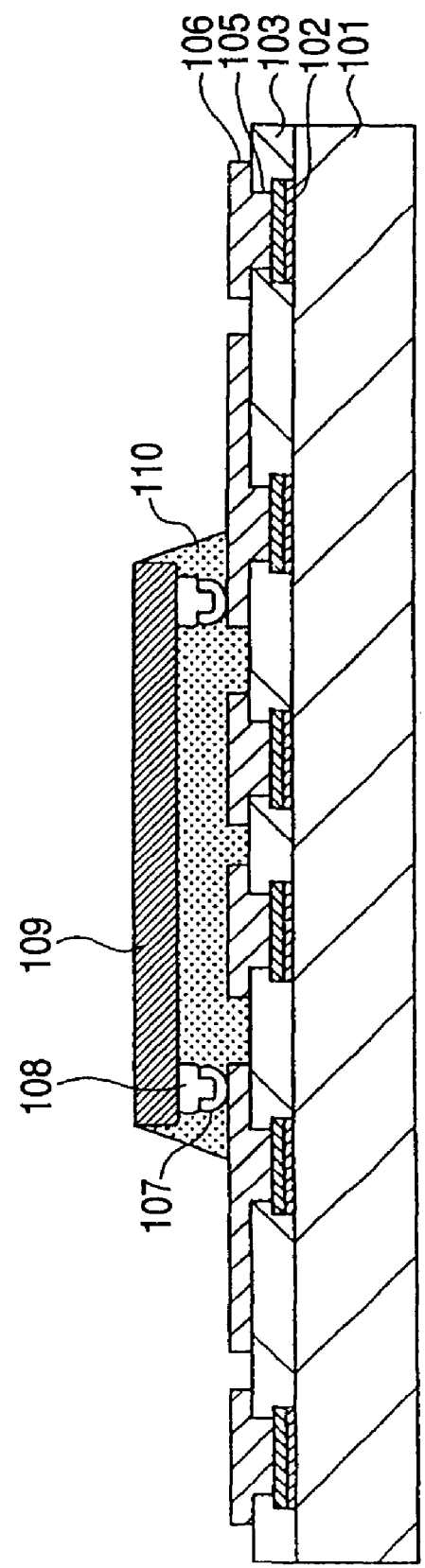
FIG. 3G is a seventh view illustrating a method of manufacturing the wiring board according to a first embodiment.

Subsequently, in a step shown in FIG. 3G, the semiconductor chip 109 is provided (mounted) on the pattern wiring 106. In this case, the stud bumps 108 made of, for example, Au are provided on the electrode pads (not shown) of the semiconductor chip 109. The semiconductor chip 109 is mounted thereon so that the stud bumps 108 become in contact with the connecting portions 107. At that time, the board is heated to perform reflow soldering. Thus, the reliability of the connection between the stud bumps 108 and the connecting portions 107 is enhanced.

Preferably, for example, a resin material is filled in a space between the semiconductor chip 109 and the wiring pattern 106 or the semiconductor chip 109 and the insulating layer 103 to thereby form the underfill layer 110.

Figure 3H:
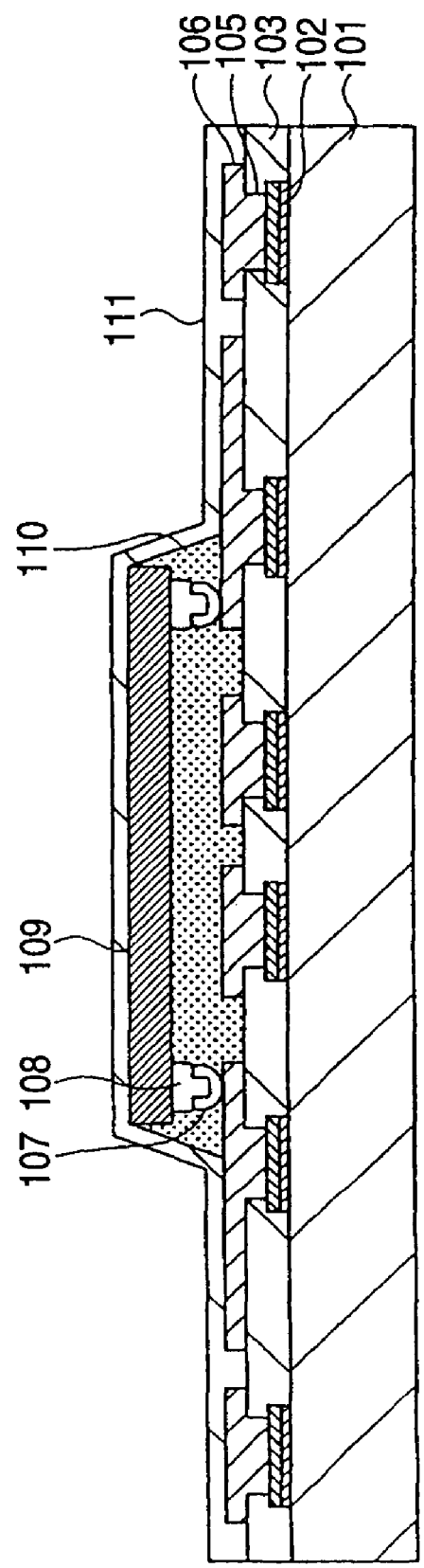
FIG. 3H is an eighth view illustrating a method of manufacturing the wiring board according to a first embodiment.

Subsequently, in a step illustrated in FIG. 3H, an insulating layer 111 made of, for instance, a heat-curable epoxy resin or a heat-curable polyimide resin is formed by, for instance, laminating, so as to cover the insulating layer 103, the pattern wiring 106 and the semiconductor chip 109.

The insulating layer 111 prevents the reinforcing member which is provided in the subsequent steps, or the pattern wiring 106 from being damaged by the reinforcing member coming into contact with the patter wiring 106. In this case, the insulating layer 111 is formed to have a thickness of about 25 μm, for example.

Especially, in a case where the insulating layer 111 is made of the same material as the material of the insulating layer 103, the insulating layers 103 and 111 become integrally formed with each other completely. Therefore, in this and subsequent figures, assuming that the insulating layers 103 and 111 form one insulating layer, the insulating layer 103 including the insulating layer 111 is shown as the insulating layer 103.

Subsequently, in a step illustrated in FIG. 3I, the reinforcing member 112 which is for example, 100 μm in thickness, and made of an organic core material (a pre-preg material), is provided (mounted) on the pattern wiring 106 through the insulating layer 103. In this case, a metal material such as Cu and Ni can be used for the reinforcing member 112. Alternatively, the reinforcing member 112 may be formed by, for instance, a plating method.

Subsequently, in a step illustrated in FIG. 3J, an insulating layer 113 made of, for instance, a heat-curable epoxy resin or a heat-curable polyimide resin is formed by laminating, so as to cover the reinforcing member 112 and the semiconductor chip 109.

Especially, in a case where the insulating layer 113 is made of the same material as the material of the insulating layer 103, the insulating layers 103 and 113 become integrally formed with each other completely. Therefore, in this and subsequent figures, assuming that the insulating layers 103 and 113 form one insulating layer, the insulating layer 103 including the insulating layer 113 is shown as the insulating layer 103.

Subsequently, in a step illustrated in FIG. 3K, a heat-curing step (a curing step) is performed by heating the insulating layer 103. In this case, the reinforcing member 112 is embedded in the insulating layer 103. Thus, a degree of warpage of the insulating layer 103 due to change in temperature is suppressed, so that the insulating layer 103 can maintain a favorable flatness.

Subsequently, in a step shown in FIG. 3L, via holes 114 reaching the pattern wiring 106 are formed in the insulating layer 103 by using, for example, laser beams. Also, the desmear process is performed, as needed. Then, a seed layer 115 is formed on the insulating layer 103 including inner wall surfaces of the via holes 114, and the pattern wiring 106 being exposed, by, for instance, electroless Cu plating.

Subsequently, in a step illustrated in FIG. 3M, the via plugs 116 are formed by electrolytic Cu plating, using a resist pattern as a mask on which patterning is performed by a lithography process, so as to bury the via holes 114. Also, the pattern wiring 117 to be connected to the via plugs 116 is formed integrally with the via plugs 116. Upon completion of performing the electrolytic plating, the resist pattern is peeled off. Moreover, unnecessary portions of seed layer 115 formed on the insulating layer 103 are removed by etching.

Subsequently, in a step illustrated in FIG. 3N, a solder resist layer 118 is formed on the pattern wiring 117 and the insulating layer 103 so that some parts of the pattern wiring 117 expose. Then, the terminal connection portions 119 made of, for instance, Ni/Au is formed on the exposed parts of the pattern wiring 117 is exposed, by electroless plating.

Subsequently, in a step illustrated in FIG. 3O, the core board 101 made of, for example, Cu is removed by, for instance, etching. Then, the solder resist layer 120 is formed, as illustrated in FIG. 1. Then, the solder bumps 121 are formed, as needed. Thus, the wiring board 100 is formed.

In this embodiment, the core board 101 made of, for example, Cu is removed by etching. However, alternatively, the core board 101 may be provided with a release layer on a side to be in contact with the insulating layer 103, by preparing the core board 101 onto which an adhesive release tape is applied, for example. Preferably, adhesive strength of the release layer lowers by being heated. In this case, in the step of removing the core board 101 from the insulating layer 103 as shown in FIG. 3O, the insulating layer 103 is peeled off from the release layer by heating the entire wiring board with, for instance, an oven.

Figure 3I:
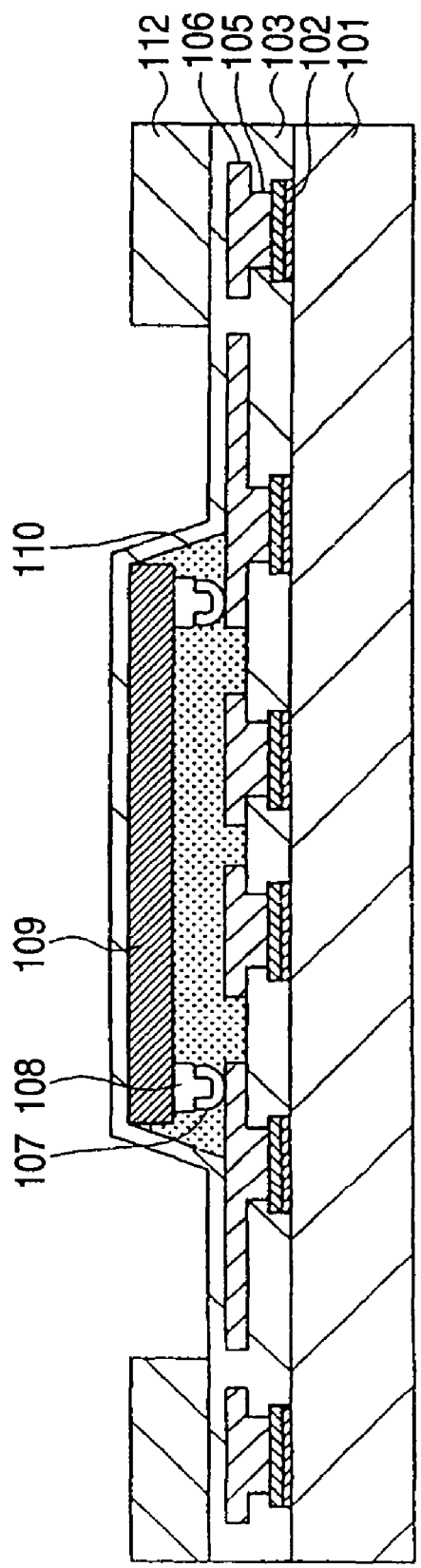
FIG. 3I is a ninth view illustrating a method of manufacturing the wiring board according to a first embodiment.
Figure 3J:
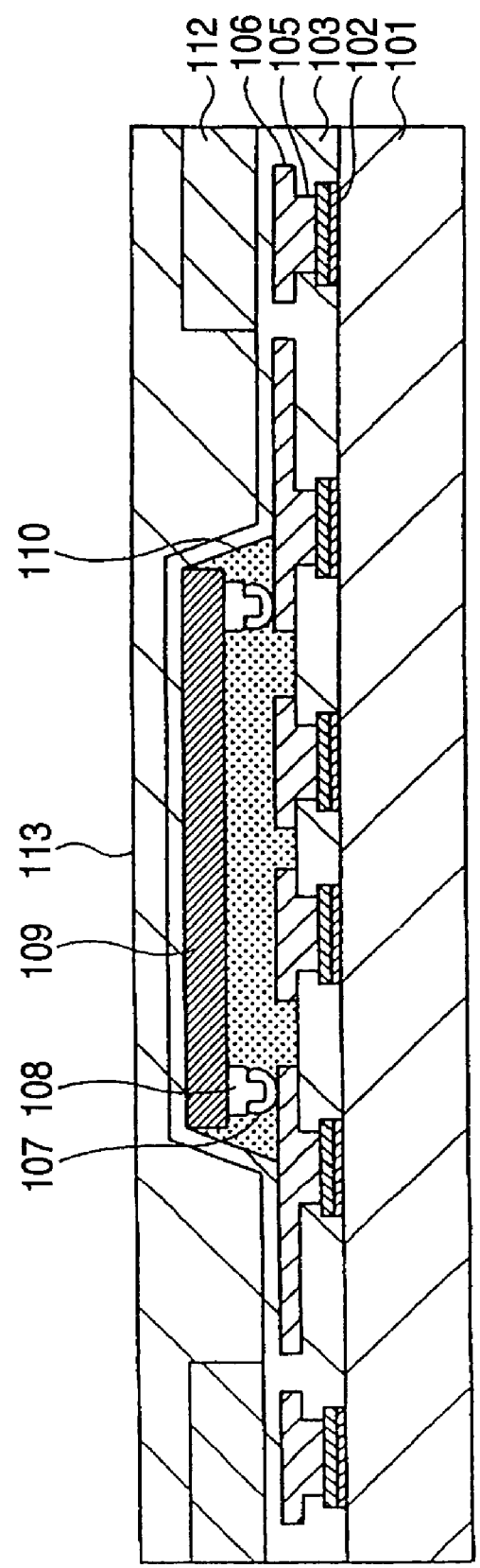
FIG. 3J is a tenth view illustrating a method of manufacturing the wiring board according to a first embodiment.
Figure 3K:
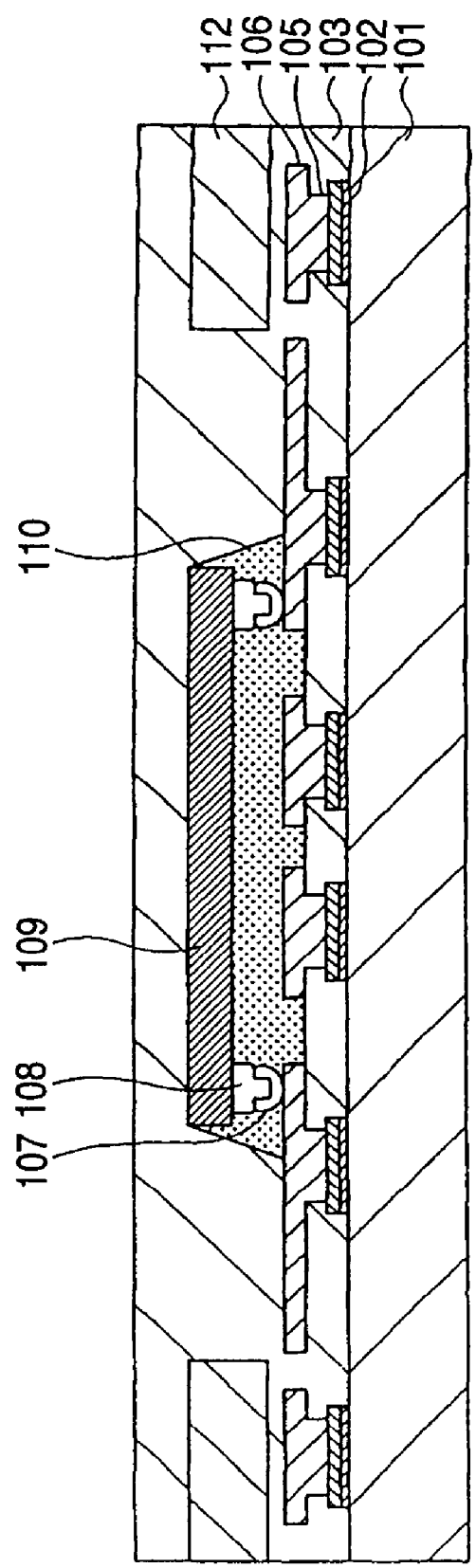
FIG. 3K is an eleventh view illustrating a method of manufacturing the wiring board according to a first embodiment.
Figure 3L:
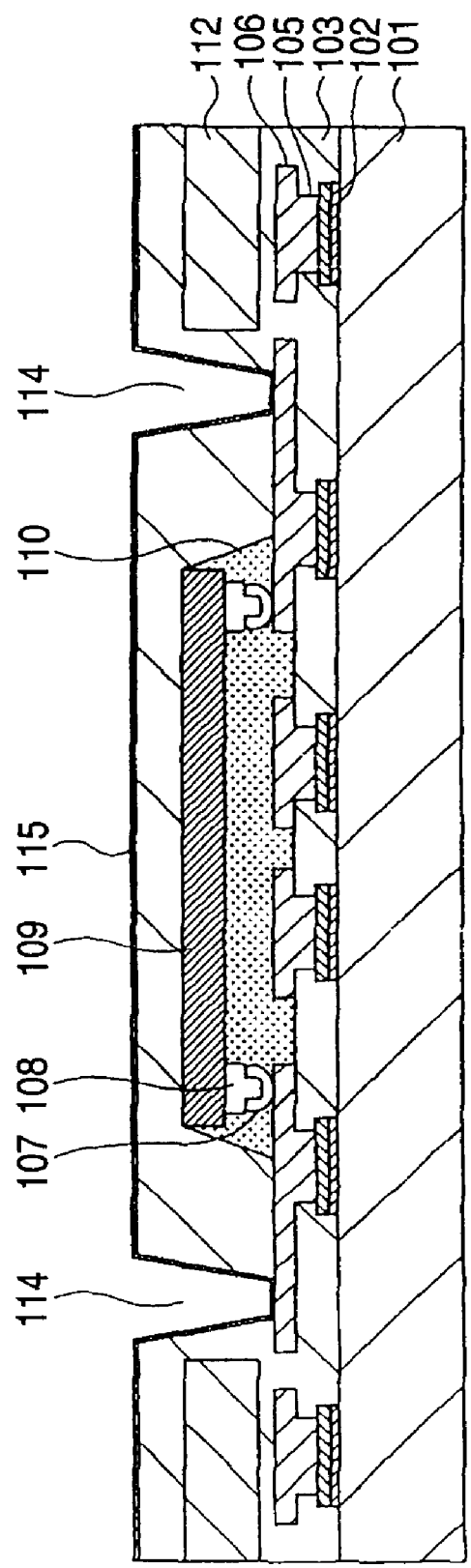
FIG. 3L is a twelfth view illustrating a method of manufacturing the wiring board according to a first embodiment.
Figure 3M:
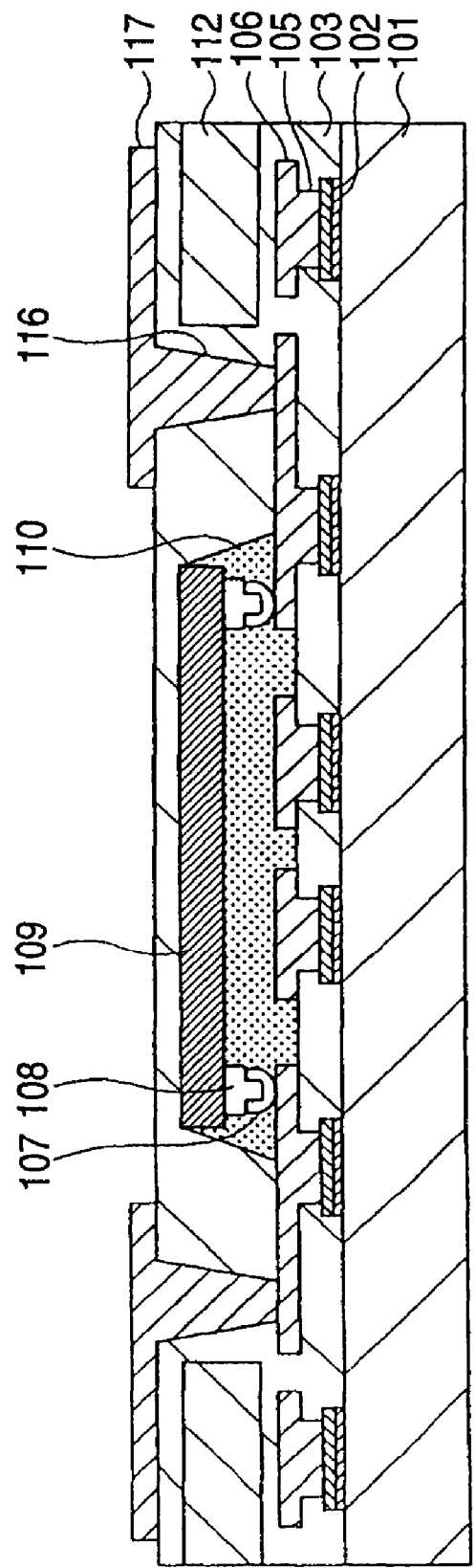
FIG. 3M is a thirteenth view illustrating a method of manufacturing the wiring board according to a first embodiment.
Figure 3N:
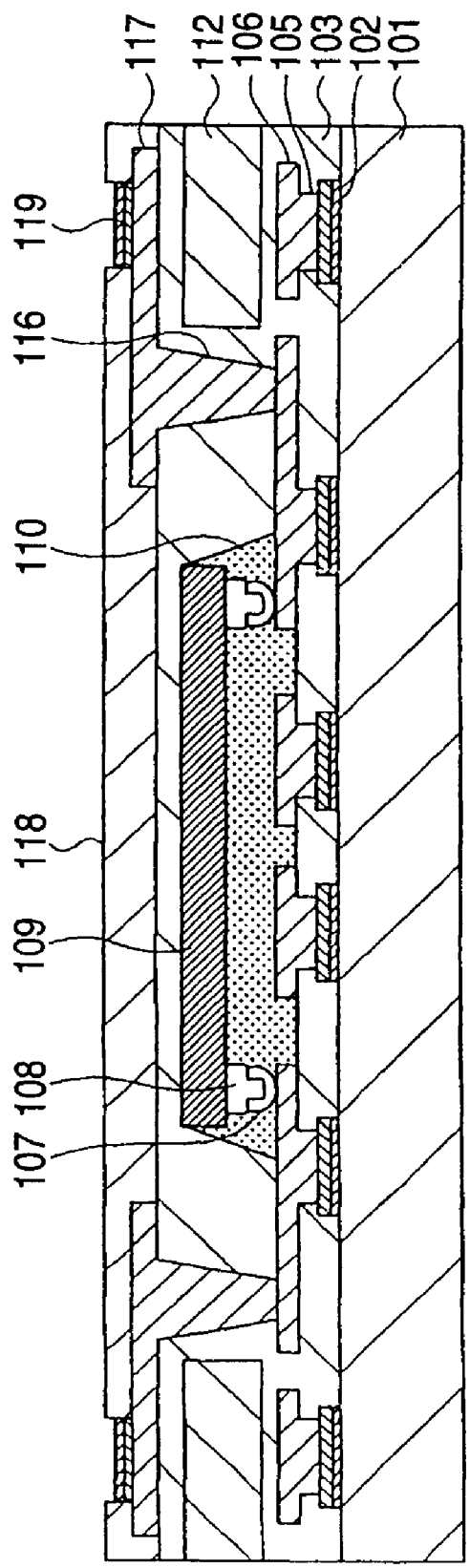
FIG. 3N is a fourteenth view illustrating a method of manufacturing the wiring board according to a first embodiment.
Figure 30:
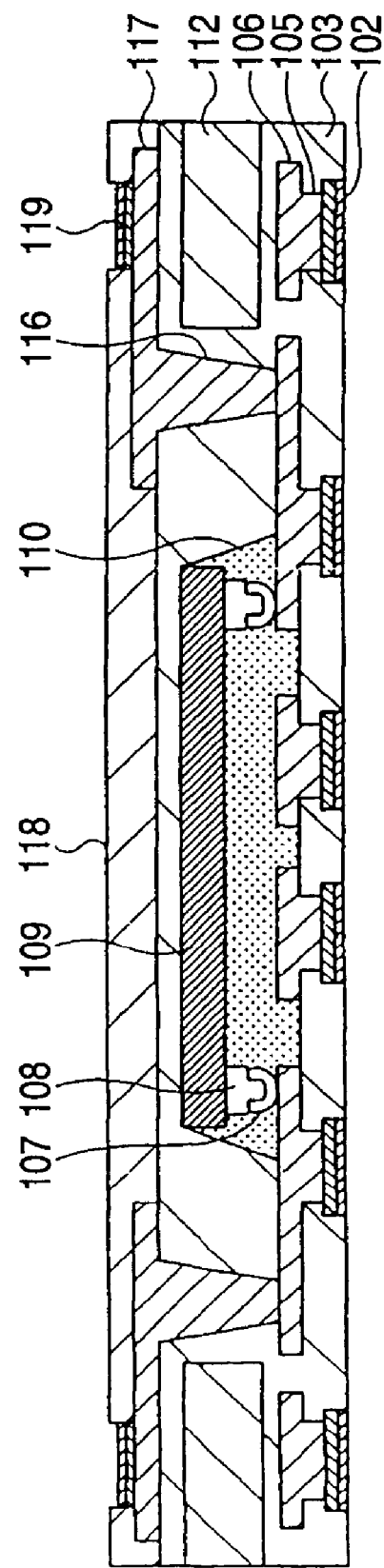

In accordance with the manufacturing method according to this embodiment, the reinforcing member 112 is provided in the step illustrated in FIG. 3I. Then, in the step illustrated in FIG. 3K, the curing is performed on the insulating layer 103 in which reinforcing member 112 is embedded. Thus, in the subsequent steps, an advantage in suppressing the degree of warpage of the insulating layer 103 or the entire wiring board is obtained. Especially, the degree of warpage due to change in stress which is caused by rise/fall of temperature, and to change in stress which is caused by the plating, the desmear process, the laminating process, and the like, is more effectively suppressed as compared with the related method. Consequently, a wiring board can be formed of which degree in flatness is high and which has high reliability.

Additionally, in this embodiment, for example, the wiring board 100 is formed on the core board 101 made of, for instance, Cu in the predetermined manufacturing process. Thus, the degree of warpage in the manufacturing process is suppressed. Also, the core board 101 is removed upon completion of performing the predetermined manufacturing process. Thus, the reduction in the thickness of the wiring board can be achieved.

The wiring board according to the invention is not limited to the aforementioned embodiment. For example, the wiring structure or the reinforcing member may be modified or changed in various manners.

For instance, FIG. 4 schematically shows a wiring board 200, which is a modification of the wiring board 100.

Referring to FIG. 4, in the wiring board 200 shown in this figure, an insulating layer 203, terminal connection portions 202 and 219, a semiconductor chip 209, a stud bump 208, a connecting portion 207, an underfill layer 210, solder resist layers 218 and 220, and a reinforcing member 212 respectively correspond to the insulating layer 103, the terminal connection portions 102 and 119, the semiconductor chip 109, the stud bump 108, the connecting portion 107, the underfill layer 110, the solder resist layers 118 and 120, and the reinforcing member 112 of the wiring board 100 shown in FIG. 1. The wiring board 200 has a structure similar to that of the wiring board 100.

In the case of the wiring board 200, a number of layers of the wiring structure connected to the semiconductor chip 209 is increased, as compared with the wiring board 100. For instance, the wiring board 100 has two layers of wirings in total, one layer of which is provided on the lower side of the semiconductor chip, and the other layer of which is provided on the upper side of the semiconductor chip. The wiring board 200 has four layers of wirings in total, two layers of which are provided on the lower side of the semiconductor chip, and the remaining two layers of which are provided on the upper side of the semiconductor chip.

In the case of the wiring board 200, via plugs 205 and 216 are connected to a pattern wiring 206 to which the semiconductor chip is connected. Further, the via plug 205 is connected to a pattern wiring 223, and the pattern wiring 223 is connected to a via plug 222 on which the terminal connection portion 202 is formed. On the other hand, a pattern wiring 217 is connected to the via plug 216. The pattern wiring 217 is connected to a pattern wiring 225 on which the terminal connection portion 219 is formed, through a via plug 224.

Thus, the number of layers of wirings can be changed, as needed.

The wiring board 200 can be formed in various shapes and thicknesses according to the specification of the semiconductor chip and the specification of the connection. An example of the practical thickness of the wiring board is described below.

For example, in a case where a thickness D5 of the semiconductor chip 209 is set to be 80 μm, a distance D4 from the upper end surface of the semiconductor chip 209 to the pattern wiring 217 is 20 μm. A distance D6 from the lower end surface of the semiconductor chip 209 to the upper end surface of the pattern wiring 206 is 45 μm.

A thickness d6 of the solder resist layer 218 and a thickness d12 of the solder resist layer 220 are 30 μm. A distance d11 from the upper end surface of the solder resist layer 220 to the lower end surface of the pattern wiring 223 is 25 μm. A distance d10 from the lower end surface of the pattern wiring 223 to the lower end surface of the pattern wiring 206 is 25 μm. A thickness d9 of the pattern wiring 206 is 10 μm. A distance d8 from the upper end surface of the pattern wiring 206 to the lower end surface of the pattern wiring 217 is 145 μm. A distance d7 from the lower end surface of the pattern wiring 217 to the lower end surface of the solder resist layer 218 is 25 μm.

In this case, the thickness of the wiring board 200 (excluding the solder bump) is equal to 290 μm.

Figure 5:
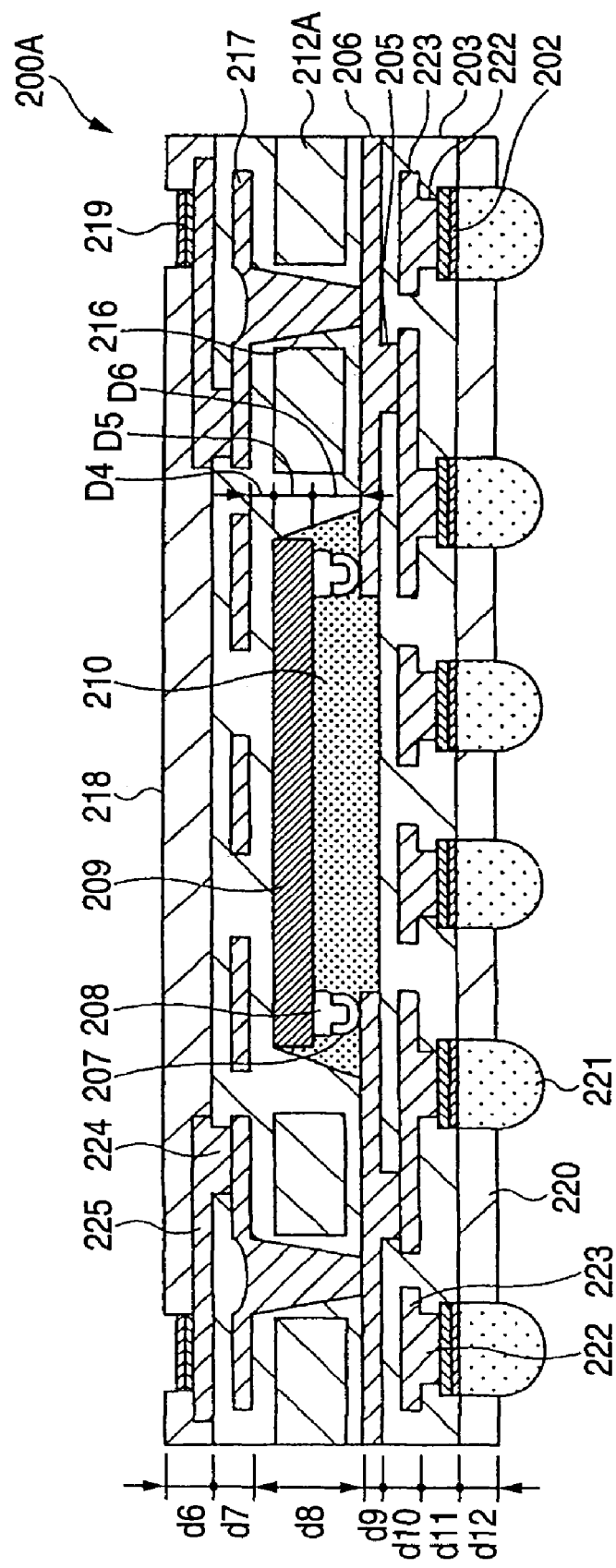
FIG. 5 is a view illustrating a second modification of the wiring board shown in FIG. 1.

FIG. 5 is a view schematically illustrating a wiring board 200A, which is another modification of the wiring board 100. Incidentally, in this figure, the aforementioned components are designated by the same reference numerals. Thus, the description of such components is omitted.

Referring to FIG. 5, in the wiring board 200A shown in this figure, a reinforcing member 212A corresponding to the reinforcing member 212 is formed also in vicinity of the semiconductor chip 209. A total area of the reinforcing member 212A is larger than that of the reinforcing member 212.

In this case, hole portions for forming the via plugs 216 are formed in the reinforcing member 212A.

Thus, various modifications and alterations of the reinforcing member and the wiring structure may be made, as required.

In the above embodiments, the reinforcing member is mounted in a face-down type (a flip-chip type) wiring board so as to suppress the warpage of the wiring board. However, alternatively, the reinforcing member may be mounted in a face-up type wiring board. Also, the warpage of the face-up type wiring board can be effectively suppressed by mounting the reinforcing member in the insulating layer in which the semiconductor chip is embedded, without practically increasing the thickness of the face-up type wiring board.

While the invention has been described with reference to specific embodiments, various modifications and alterations may be made by those skilled in the art without departing from the spirit and scope of the invention described in the appended claims.

According to the invention, the reduction in the thickness of the wiring board incorporating semiconductor chips is enabled, and also the suppression of the warpage of such a wiring board is possible.

What is claimed is:

1. A wiring board comprising:
   at least one semiconductor chip;
   an insulating layer in which said at least one semiconductor chip is embedded;
   a wiring structure connected to the semiconductor chip;
   a bump provided between the wiring structure and the semiconductor chip; and
   at least one reinforcing member for reinforcing the insulating layer, the reinforcing member being embedded in the insulating layer such that the reinforcing member and the semiconductor chip are mounted substantially on a same plane but are separated by the insulating layer such that the insulating layer is directly adjacent to the semiconductor chip on the same plane defined by the reinforcing member and the semiconductor chip.

2. The wiring board according to claim 1, wherein the reinforcing member is formed so as to surround the semiconductor chip.

3. The wiring board according to claim 1, wherein the wiring structure has a multilayer wiring structure.

4. The wiring board according to claim 1, wherein the wiring structure includes:
- a first wiring substructure being formed on a first side of the semiconductor chip; and
- a second wiring substructure being formed on a second side of the semiconductor chip.

5. The wiring board according to claim 4, wherein the first wiring substructure and the second wiring substructure are connected by a via plug being formed in the insulating layer.

6. The wiring board according to claim 1, further comprising:
- a first terminal connection portion formed on a first surface of the wiring board, the first terminal connection portion being connected to the semiconductor chip through the wiring structure; and
- a second terminal connection portion formed on a second surface of the wiring board, the second terminal connection portion being connected to the semiconductor chip through the wiring structure.

7. The wiring board according to claim 1, wherein the reinforcing member is made of an organic core material or a metal material.

8. The wiring board according to claim 1 further comprising a solder connecting portion directly connected between the bump and the wiring structure.

9. The wiring board according to claim 1, wherein the bump is a stud bump.

* * * * *